United States Patent [19]

Kobayashi et al.

[11] 4,454,476
[45] Jun. 12, 1984

[54] METHOD OF AND APPARATUS FOR SYNTHETIC TESTING OF A MULTI-BREAK CIRCUIT BREAKER

[75] Inventors: Akio Kobayashi, Yokohama; Satoru Yanabu, Tokyo; Shoji Yamashita, Yokohama, all of Japan

[73] Assignee: Tokyo Shibaura Denki Kabushiki Kaisha, Kawasaki, Japan

[21] Appl. No.: 395,712

[22] Filed: Jul. 6, 1982

[30] Foreign Application Priority Data

Jul. 14, 1981 [JP] Japan .............................. 56-108843

[51] Int. Cl.³ ........................................... G01R 31/02
[52] U.S. Cl. ..................................... 324/424; 324/415
[58] Field of Search .................... 324/51, 54, 415, 418, 324/424

[56] References Cited

U.S. PATENT DOCUMENTS

| | | | |
|---|---|---|---|
| 3,038,116 | 6/1962 | Einsele | 324/424 |
| 4,147,975 | 4/1979 | Pratsch et al. | 324/424 |
| 4,326,167 | 4/1982 | Fehr | 324/424 |

*Primary Examiner*—Michael J. Tokar

*Attorney, Agent, or Firm*—Stevens, Davis, Miller & Mosher

[57] ABSTRACT

In a method of and apparatus for synthetic testing of a multi-break circuit breaker having a metallic tank and a series connection of interrupter units, and a non-grounded and a grounded lead conductors connected to the first and the second ends of the series connection, a short-circuit current is made to flow through the series connection, the circuit breaker is then operated, and upon completion of the interruption of the current, a first transient recovery voltage is supplied to the non-grounded lead conductor and is applied, in effect, across a first one of the interrupter units at the second end or across a train of interrupter units including said first one of the interrupter unit, and, simultaneously, a second transient recovery voltage is supplied to the tank, the first and the second transient recovery voltages having the same polarity and the second transient recovery voltage having substantially the same magnitude as the whole transient recovery voltage to be applied across all the interrupter units of the circuit breaker.

11 Claims, 8 Drawing Figures

FIG. I
PRIOR ART
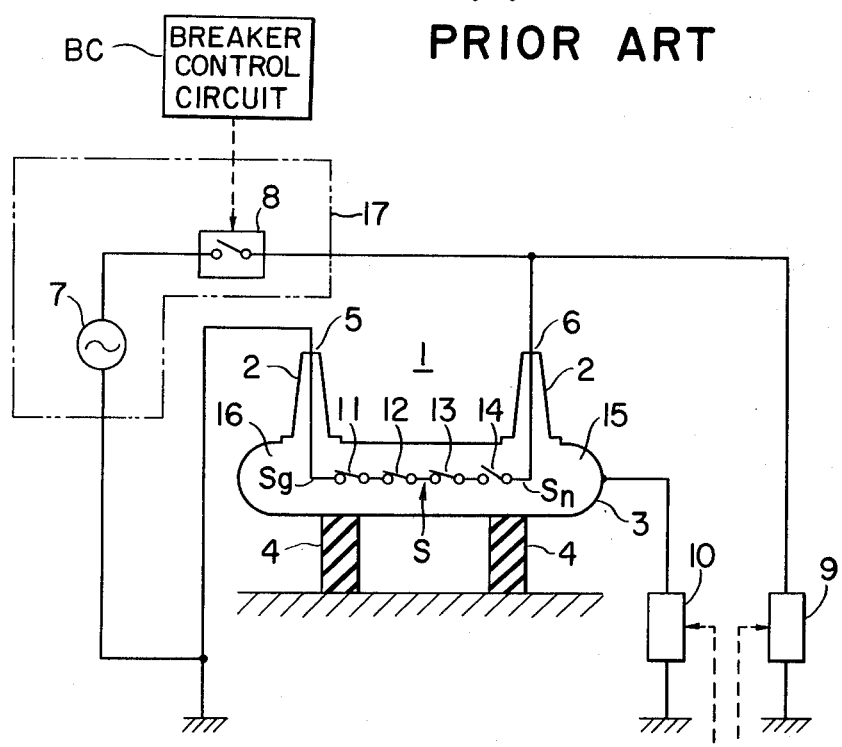
FIG. 2
PRIOR ART
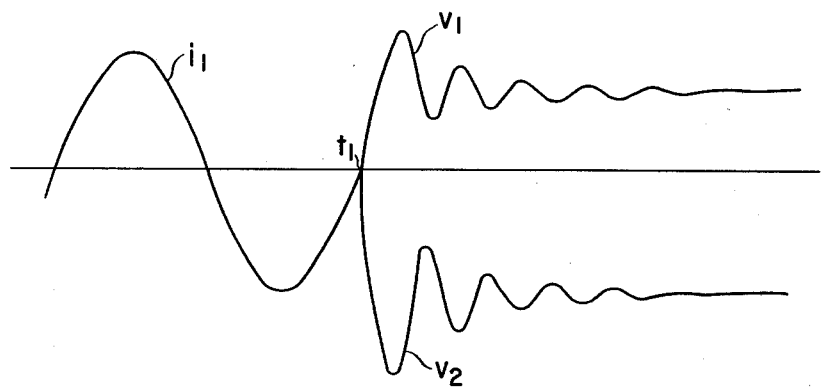

METHOD OF AND APPARATUS FOR SYNTHETIC TESTING OF A MULTI-BREAK CIRCUIT BREAKER

BACKGROUND OF THE INVENTION

The present invention relates to a method of and apparatus for synthetic testing of a multi-break circuit breaker, wherein the interrupter units are enclosed within, insulated from and supported by a metallic tank.

In recent years, the voltage and the capacity of power transmission systems are becoming higher and higher to a point where a transmission line of 1100 KV is envisaged. In keeping step therewith, interrupting or breaking capacity of circuit breakers is becoming higher. As a result, it is increasingly difficult to test the breaking performance of all the interrupter units because of the insufficient capacity of the testing equipment. From this point of view, it has been a practice to resort to a unit testing method wherein only one interrupter unit is tested as to the breaking performance, and the voltage used for the test is multiplied by a constant related to the voltage share and the number of the interrupter units, and the result is regarded equivalent to the result of testing all the interrupter units.

The unit testing method is valid when testing a porcelain-clad circuit breaker which is not associated with the problem of production of heated gas due to an arc in the interrupter unit which impairs the insulation between the interrupter unit and the ground potential element. But with a multi-interrupter circuit breaker having interrupter units enclosed in, insulated from and supported by a metallic tank, heated gas which has passed through the arc and has its insulation strength lowered is blown into the space between the tank and an end of the series connection of the interrupter units. If a transient recovery voltage to test the performance of a single interrupter unit only is applied in accordance with the unit testing method, performance of the interrupter units may be properly tested, but the insulation between the tank and the end of the series connection immediately after the interruption is not properly tested.

FIG. 1 shows an arrangement used for implementing another conventional method. FIG. 2 shows the voltages and current appearing at various portions in the arrangement shown in FIG. 1. A multi-break circuit breaker 1 to have its breaking performance tested has, for example, four series-connected interrupter units 11-14. The series connection S of the interrupter units 11-14 is insulated by porcelain insulators 2 from a tank 3. The tank 3 itself is insulated by insulating support members 4 from the ground. One end Sg of the series connection S is connected to a lead conductor 5 to the ground. The other end Sn is connected by another lead conductor 6 to a large current source 17 including a short-circuit generator 7 which supplies a large short-circuit current $i_1$ to the series connection S through an auxiliary circuit breaker 8 which is controlled by a breaker control circuit BC. Of all the interrupter units, the one 14 at the non-grounded end Sn alone is opened (alternatively a train of interrupter units may be opened) at a timing related to the phase of the current $i_1$, to cause an arc in the interrupter unit 14. At a time point $t_1$ when the instantaneous value of the current $i_1$ becomes zero, a first high voltage source 9, being controlled by a voltage source control circuit VC, supplies a transient recovery voltage $v_1$ for testing the interrupter unit, across the lead conductor 6 and the ground potential. Substantially simultaneously therewith, a second high voltage source 10, being controlled by the control circuit VC, supplies a voltage $v_2$ across the tank 3 and the ground potential in a polarity reverse to $v_1$. The magnitude of $v_2$ is a difference between the whole restriking voltage $v_0$ which is to be applied to all the interrupter units (11-14) and the transient recovery voltage $v_1$ from the first high voltage source.

In this method, the whole transient recovery voltage $v_0 = |v_1| + |v_2|$ is applied across the space 15 between the ungrounded end of the series connection S and the tank, so that insulation of the space 15 and the performance of the interrupter unit 14 are simultaneously tested.

But when the insulation break-down of the space 15 occurs, the high voltage $v_2$ from the second voltage source 10 is applied to the first voltage source 9 and may damage components provided in it. Such possibility is greater if a smaller number of the interrupter units are actually opened, i.e., if $v_2/v_1$ is larger.

SUMMARY OF THE INVENTION

An object of the invention is to provide a method of and apparatus for synthetic testing of a multi-break circuit breaker, in which components in the high voltage source are kept away from damages even when an insulation break-down occurs between an end of the series connection of interrupter units and the tank.

Another object of the invention is to provide a method of and apparatus for synthetic testing of a multi-break circuit breaker, which is economical to implement or manufacture.

According to one aspect of the invention, there is provided a method of synthetic testing of a multi-break circuit breaker having a metallic tank forming the enclosure of the circuit breaker and a series connection of interrupter units supported by and insulated from the tank, and a first and a second lead conductors connected to the first and second ends of the series connection and being insulated from the tank, said method comprising the steps of:

connecting the first and second lead conductors to a first and second output terminals of a first voltage source supplying a first transient recovery voltage;

connecting the tank and the second lead conductor to a first and second output terminals of a second voltage source supplying a second transient recovery voltage;

causing a short-circuit current to flow through the series connection of the interrupter units;

operating the circuit breaker to interrupt the current;

operating, when the interruption of the current through the series connection of the interrupter units is completed, the first voltage source;

conditioning the circuit breaker so that the first transient recovery voltage supplied from the first voltage source is applied, in effect, across a first one of the interrupter units at the second end of the series connection or across a train of interrupter units consisting of part only of the series connection of the interrupter units and including said first one of the interrupter units; and operating, simultaneously with the operation of the first voltage source, the second voltage source whereby the second transient recovery voltage supplied from the second voltage source is applied across the tank and the second lead conductor;

the first transient recovery voltage having substantially the same magnitude as a partial transient recovery voltage to be applied across the interrupter unit or units whose breaking performance is to be tested;

the second transient recovery voltage having substantially the same magnitude as a whole transient recovery voltage to be applied across all the interrupter units of the circuit breaker; and the polarity of the first transient recovery voltage on the first output terminal with reference to the second output terminal of the second voltage source being the same as the polarity of the second transient recovery voltage on the first output terminal with reference to the second output terminal of the first voltage source.

According to another aspect of the invention, there is provided apparatus for synthetic testing of a multi-break circuit breaker having a metallic tank forming the enclosure of the circuit breaker and a series connection of interrupter units supported by and insulated from the tank, and a first and a second lead conductors connected to the first and second ends of the series connection and being insulated from the tank, said apparatus comprising:

a current source having its output terminals connected to the first and the second lead conductors for supplying, a current through the series connection of the interrupter units;

a first voltage source having its first and second output terminals connected to the first and second lead conductors, respectively, for supplying a first transient recovery voltage to be applied across the interrupter unit or units whose breaking performance is to be tested; and a second voltage source having its first and second output terminals connected to the tank and the second lead conductor, respectively, for supplying a second transient recovery voltage, having substantially the same magnitude as a whole transient recovery voltage to be applied across all the interrupter units of the circuit breaker, the polarity of the voltage on the first output terminal with reference to the second output terminal of the second voltage source being the same as the polarity of the voltage on the first output terminal with reference to the second output terminal of the first voltage source.

BRIEF DESCRIPTION OF THE DRAWINGS

In the accompanying drawings:

FIG. 1 is a schematic diagram showing an arrangement used in a conventional testing method;

FIG. 2 is a waveform diagram showing voltages and currents appearing at various portions in the arrangement shown in FIG. 1;

DETAILED DESCRIPTION OF THE EMBODIMENTS

Figure 3:
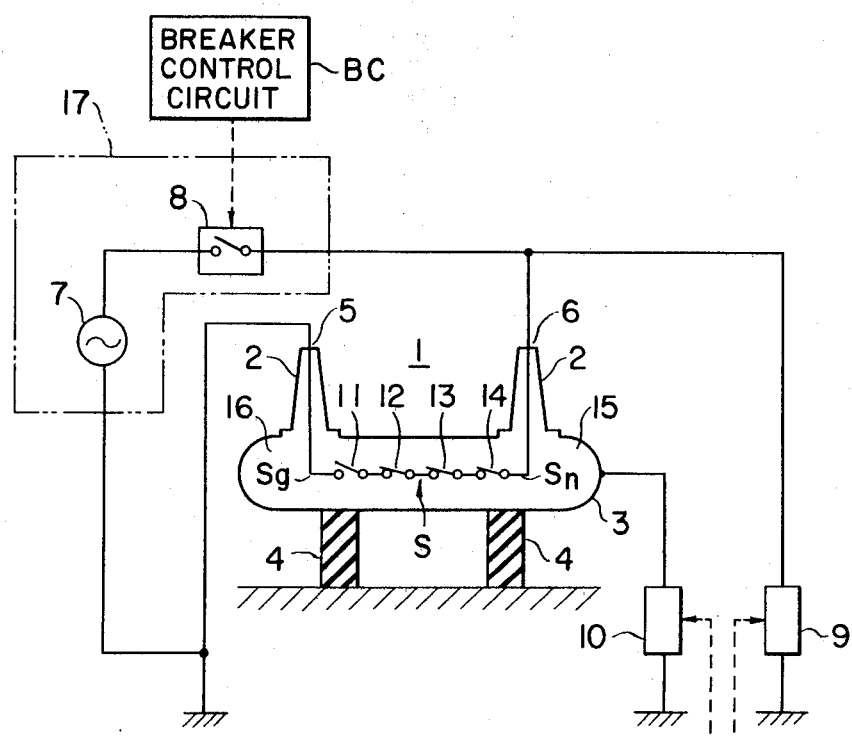
FIG. 3 is a schematic diagram showing an arrangement used for implementing an embodiment of the invention.

Referring to FIG. 3, there is shown an arrangement used for implementing an embodiment of the invention. The same reference characters as those in FIG. 1 denote identical or similar members. As will be seen, the arrangement is generally identical to that shown in FIG. 1. The difference is that, the circuit breaker 1 is so conditioned that, when the voltage $v_1$ is supplied from the high voltage source 9, substantially the entirety of $v_1$ is applied across the interrupter unit 11 at the grounded end Sg of the series connection S or across a train of interrupter units including the unit 11. For instance, only the unit 11 is opened and other units 12-14 are kept closed, as illustrated in FIG. 3. Moreover, the second voltage source 10 supplies a voltage $v_2$ which is of the same polarity as $v_1$ and is of substantially the same magnitude as a whole transient recovery voltage to be applied across all the interrupter units 11-14.

The control circuit BC is adapted to close the auxiliary circuit breaker 8 to cause the short-circuit current $i_1$ to flow through the series connection S and to open the auxiliary circuit breaker 8 to terminate the supply of the current upon operation of the circuit breaker to be tested. The control circuit VC causes, when the interruption of the current through the series connection is completed, the voltage sources 9 and 10 to supply voltages.

The arrangement described above will enable simultaneous testing of the breaking performance of the interrupter unit 11 and of the space 16 between the tank 3 and the nongrounded end Sn of the series connection S.

As a result, the nongrounded and Sn of the series connection is kept substantially at the same potential as one of the contacts of the interrupter unit 11 which is connected to the interrupter unit 12.

Figure 4:
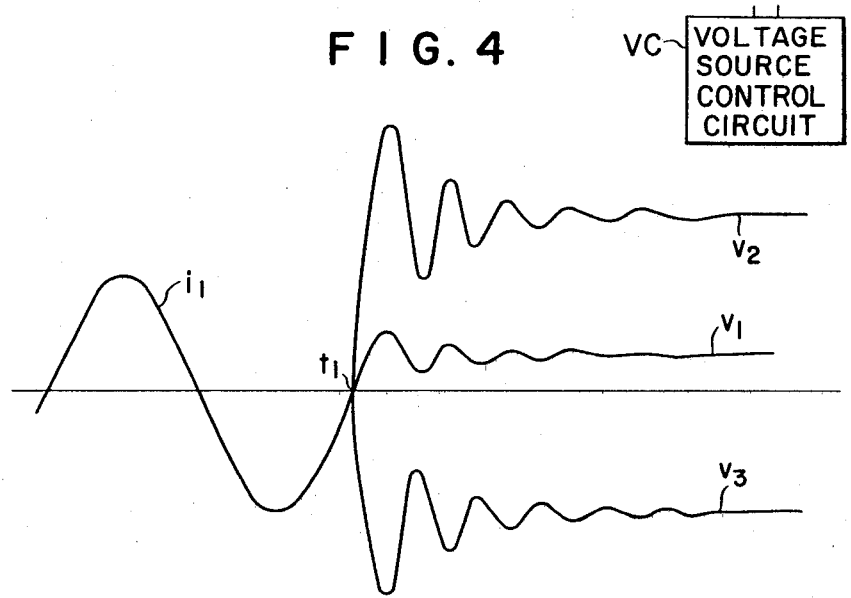
FIG. 4 is a waveform diagram showing voltages and currents appearing at various portions in the arrangement shown in FIG. 3.

Accordingly, the potential at the conductive portions from the nongrounded end Sn through the interrupter unit 12 is at $v_1$. Hence, the voltage across the tank and these conductive portions are $v_3$ (FIG. 4) which is the difference between $v_1$ and $v_2$. In the example shown, there are four interrupter units, and $v_1$ is about one-fourth of $v_2$. Accordingly, the voltage across the tank 3 and the nongrounded end Sn is about $\frac{3}{4}$ of $v_2$. Moreover, an arc occurs at the interrupter unit 11 and not at the interrupter units 12-14 since they are kept closed. For this reason, if an insulation break-down is to occur between the tank and the interrupter units, it will occur between the tank and the grounded end Sg. Therefore, the voltage from the second voltage source 10 is not applied to the first voltage source 9 nor to the current source 7, so that components provided in them are not subjected to the high voltage from the second voltage source 9, and thus kept safe from the damages.

In the above description, the interrupter units 12-14 are kept closed when the interrupter unit 11 is opened. But alternatively, the interrupter units 12-14 may be shunted by a short-circuiting conductor, not shown.

Figure 5:
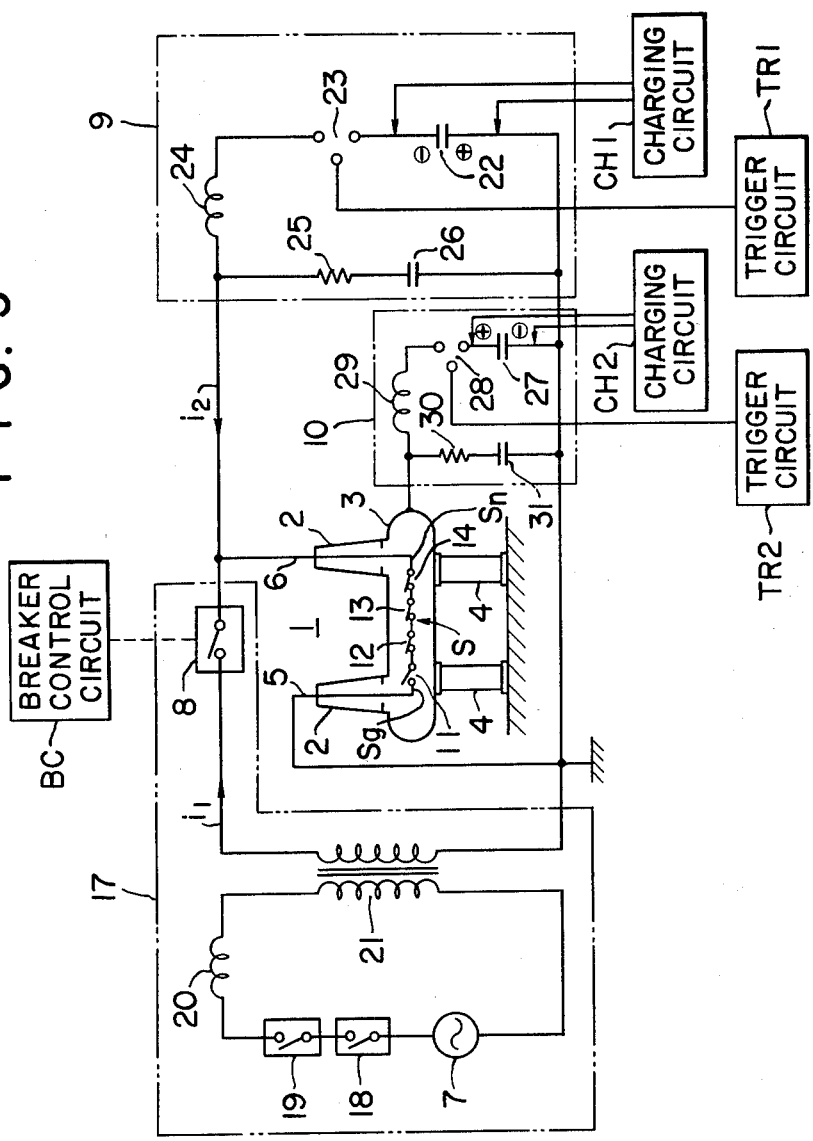
FIG. 5 is a schematic diagram showing an arrangement used for implementing another embodiment of the invention.

FIG. 5 shows an arrangement used for implementing another embodiment of the invention, in which the short circuit generator 7 is associated with other circuit components including a back-up circuit breaker 18, a making switch 19, a reactor 20 for current adjustment, and a transformer 21, all of which, together with the short-circuit generator 7 and the auxiliary circuit breaker 8 form a large current source 17 to supply a necessary short-circuit current $i_1$ through an auxiliary circuit breaker 8 to the series connection S of the circuit breaker 1.

A first high voltage source 9 of this embodiment includes a series connection of a capacitor 22, a gap 23 and a reactor 24 connected across the lead conductor 6 and the ground potential. The capacitor 22 is charged in a polarity shown in advance by a charging circuit CH1 in the control circuit VC. The gap 23 is "fired" by a trigger control circuit TR1 in the control circuit VC, at a time point $t_2$ which is a little before the time point $t_3$ when $i_1$ becomes zero, to discharge the capacitor 22. The discharging current $i_2$ which constitutes the injection current is essentially determined by the capacitance of the capacitor 22 and the inductance of the reactor 24. The current $i_2$ is partly superimposed on $i_1$ and becomes zero at $t_4$, shortly after $t_3$.

The auxiliary circuit breaker 8 is opened substantially simultaneously with the circuit breaker 1, and completes the interruption of the current at $t_3$ to disconnect the large current source 17 from the first high voltage source 9. After $t_3$, only $i_2$ flows through the series connection S of the circuit breaker 1, and at $t_4$ when $i_2$ becomes zero, the interruption of the current is completed.

At $t_4$, the capacitor 22 is charged in a polarity reverse to the initial charging, and thereafter causes a damped oscillation current to flow through the reactor 24, a resistor 25 and a capacitor 26. During such damped oscillation, the voltage across the resistor 25 and the capacitor 26 is applied across the lead conductor 6 and the ground potential as a transient recovery voltage $v_1$ to test the breaking performance of the interrupter unit 11.

A second high voltage source 10 of this embodiment includes a series connection of a capacitor 27, a gap 28 and a reactor 29 connected across the tank 3 and the ground potential. The capacitor 27 is charged in advance in a polarity shown by a charging circuit CH2 in the control circuit VC.

If the first and the second high voltage sources are formed by connecting, in the same manner, the same circuit components, it is easy to obtain $v_1$ and $v_2$ of the same (except for the magnitude) waveform. That is, the reactor 29 of the second high voltage source 10 is made to have a greater inductance than the reactor 24 of the first high voltage source, and the capacitor 27 of the second high voltage source 10 is made to have a greater capacitance than the capacitor 22 of the first high voltage source 9.

Also, the capacitor 27 of the second high voltage source 10 need not supply a relatively large current, such as the one supplied by the first high voltage source 9 to the series connection S of the interrupter units. Accordingly, the capacitor 27 can be of a small capacitance, so that cost of constructing the capacitor bank forming the capacitor 27 can be made low.

It has been described that, in the embodiment of FIG. 5, the capacitor 22 is charged in a polarity 22 shown, and is discharged to provide a current $i_2$ to the series connection S of the interrupter units. But alternatively, the arrangement is such that the capacitor 22 is charged by the charging circuit CH1 in a polarity opposite to that shown, and the gap 23 is fired to discharge the capacitor 22 at $t_3$ when $i_1$ becomes zero. Accordingly, the first high voltage source 9 does not provide the injection current, and the resultant waveforms are similar to those shown in FIG. 4. In this case, to prevent delay in application of a transient recovery voltage due to possible delay in firing of the gap 23, the auxiliary circuit breaker 8 may be shunted by an impedance element, not shown, to enable application of a voltage from the large current source 17. In such an arrangement, the capacitor 22 can also be of a small capacitance, so that it can be formed of a capacitor bank of a low cost.

Figure 7:
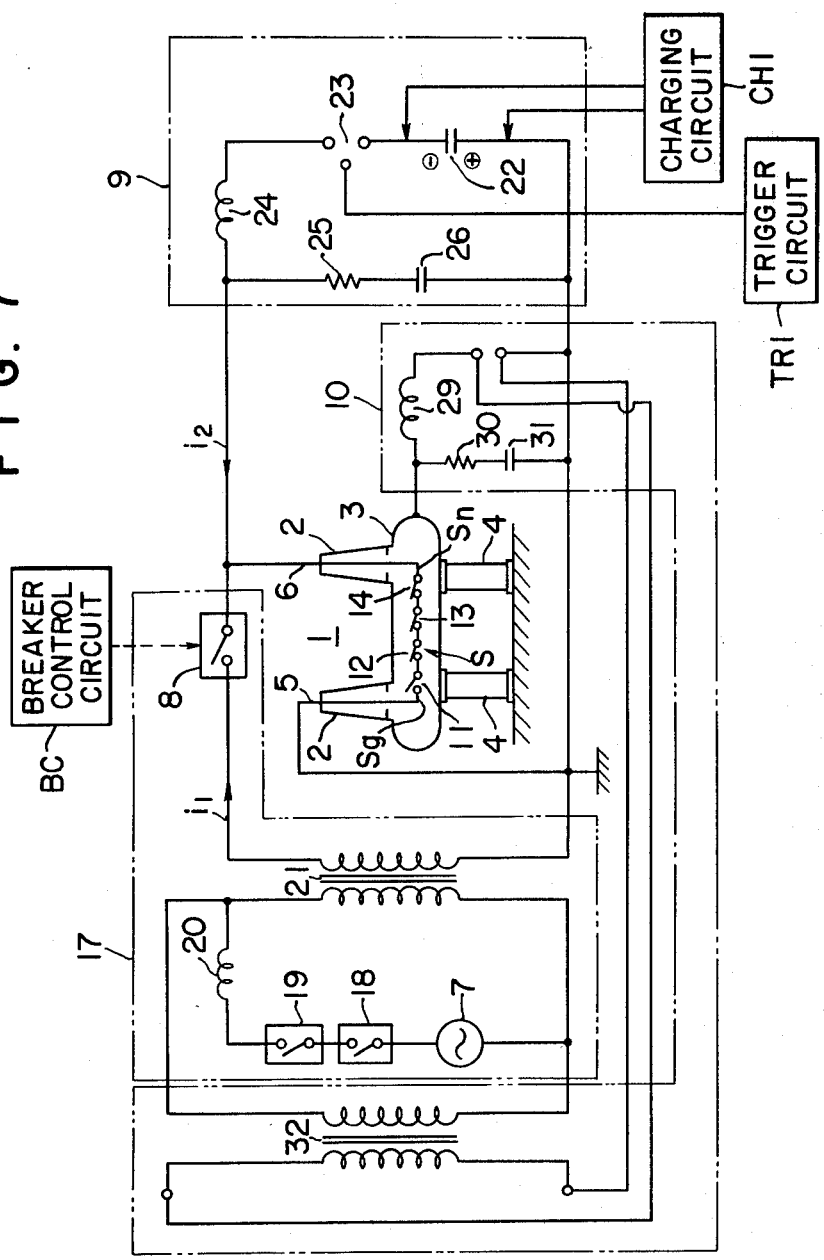
FIG. 7 is a schematic diagram showing an arrangement used for implementing a further embodiment of the invention.

FIG. 7 shows an arrangement used for implementing still another embodiment of the invention. The configuration and operation of the large current source 17 and the first high voltage source 9 are substantially identical to those described with reference to the embodiment of FIG. 5.

The second high voltage source 10 of this embodiment includes a transformer 32 whose primary winding is connected in parallel with the primary winding of the transformer 21. The secondary winding of the transformer 32 is connected in place of the capacitor 27 and the trigger gap 28 of FIG. 5, in series with the reactor 29.

As far as the interrupter units 11–14 are all closed, the voltage across the primary winding of the transformer 21 is low, so that substantially no voltage appears across the secondary winding of the transformer 32. When the current $i_1$ is interrupted by the operation of the circuit breaker 1, a high voltage appears at the secondary winding of the transformer 32, and a current flows through the reactor 29, the resistor 30 and the capacitor 31. The voltage across the resistor 30 and the capacitor 31 is applied across the tank 3 and the ground potential as a transient recovery voltage $v_2$. When the second high voltage source 10 shown in FIG. 7 is used, need of a trigger circuit for the gap 28 is eliminated.

Figure 6:
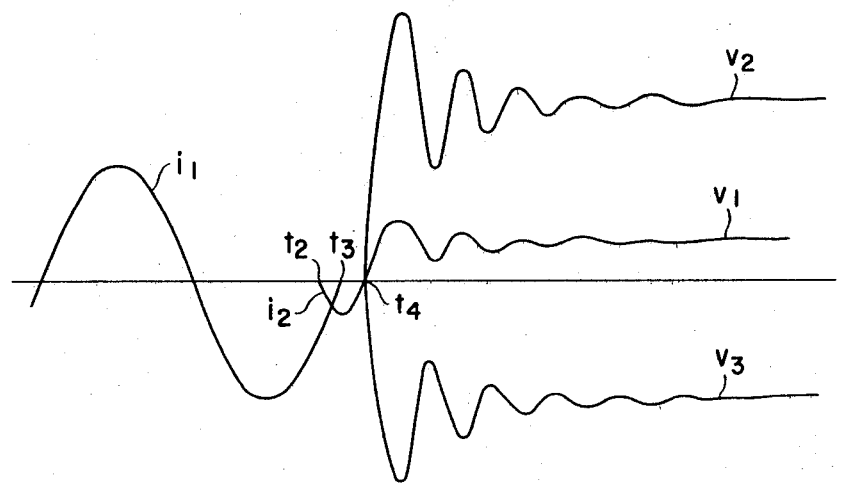
FIG. 6 is a waveform diagram showing voltages and currents appearing at various portions in the arrangement shown in FIG. 5.
Figure 8:
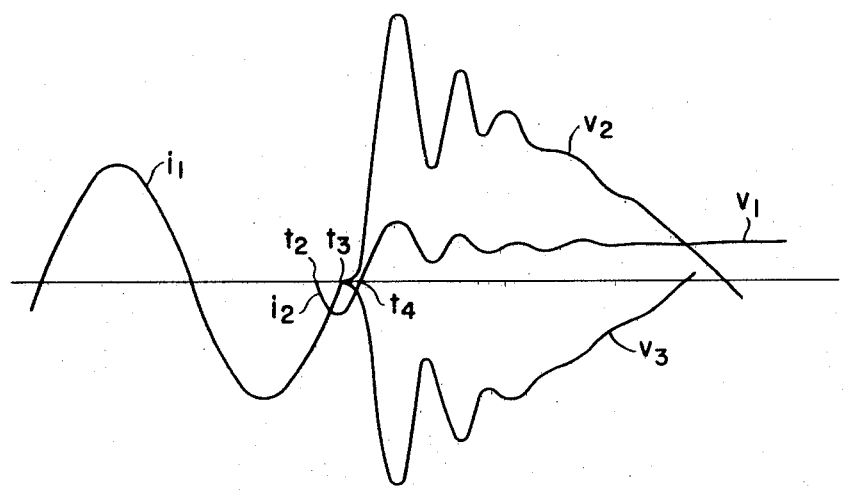
FIG. 8 is a waveform diagram showing voltages and currents appearing at various portions in the arrangement shown in FIG. 7.

Since the load of the short-circuit generator 7 comprises the arc resistance of the circuit breaker 1 and the reactor 20, the transient recovery voltage $v_2$ of the second high voltage source 10 shown in FIG. 7 does not rise immediately after $i_1$ becomes zero. Such a delay is disadvantageous when it is necessary that a transient recovery voltage need to be applied immediately after $i_1$ becomes zero. However, when the first high voltage source 9 provides an injection current $i_2$ which becomes zero shortly after $i_1$ becomes zero and the application of the transient recovery voltage is delayed until $i_2$ becomes zero, as described with reference to FIG. 6, the time point when the $v_2$ rises can be made coincident with the time point when $i_2$ becomes zero (and when $v_1$ rises) as shown in FIG. 8. Thus sufficiently equivalent effects are obtained. Moreover, the time point when $v_1$ rises can be made coincident with the rise of $v_2$ by adjusting the oscillating frequency of $i_2$ and the timing of the firing of the gap 23.

Various modifications may be made in the embodiment shown in FIG. 7. For instance, instead of connecting the transformer 32 to the short-circuit generator 7, the transformer 32 may be connected to another generator, not shown.

In place of the series connection of the capacitor 22 and the trigger gap 23, a secondary winding of a transformer may be connected. A primary winding of such a transformer may be connected either in parallel with the primary winding of the transformer 21 or to a separate generator, not shown.

In the above description, an arc is made to occur only in the interrupter 11 at the grounded end Sg of the series connection S. This is achieved, as explained, either by having only the interrupter unit 11 opened or by shunting the other interrupter units 12–14 by a short-circuiting conductor and having all the interrupter units 11–14 opened. Alternatively, an arc is made to occur in a train of two interrupter units (11 and 12) or a train of three interrupter units (11–13). The number of the interrupter units in which an arc is made to occur can be determined in accordance with the testing capacity of the first high voltage source 9; in other words, the maximum voltage which the voltage source 9 can produce.

Still alternatively, a capacitor may be connected in parallel with each of the interrupter units, with the capacitors parallel with the interrupter units tested having a smaller capacitance than the capacitors parallel with the interrupter units not tested, so that an arc is made to occur in all the interrupter units but substantially the entirety of the transient recovery voltage supplied from the first high voltage source 9 is applied across the tested interrupter units.

What is claimed is:

1. A method of synthetic testing of a multi-break circuit breaker having a metallic tank forming the enclosure of the circuit breaker and a series connection of interrupter units supported by and insulated from the tank, and a first and a second lead conductors connected to the first and second ends of the series connection and being insulated from the tank, said method comprising the steps of:
   connecting the first and second lead conductors, respectively, to a first and second output terminals of a first voltage source supplying a first transient recovery voltage;
   connecting the tank and the second lead conductor, respectively, to a first and second output terminals of a second voltage source supplying a second transient recovery voltage;
   causing a short-circuit current to flow through the series connection of the interrupter units;
   operating the circuit breaker to interrupt the current;
   operating, when the interruption of the current through the series connection of the interrupter units is completed, the first voltage source;
   conditioning the circuit breaker so that the first transient recovery voltage supplied from the first voltage source is applied, in effect, across a first one of the interrupter units at the second end of the series connection or across a train of interrupter units consisting of part only of the series connection of the interrupter units and including said first one of the interrupter units; and
   operating, simultaneously with the operation of the first voltage source, the second voltage source whereby the second transient recovery voltage supplied from the second voltage source is applied across the tank and the second lead conductor;
   the first transient recovery voltage having substantially the same magnitude as a partial transient recovery voltage to be applied across the interrupter unit or units whose breaking performance is to be tested;
   the second transient recovery voltage having substantially the same magnitude as a whole transient recovery voltage to be applied across all the interrupter units of the circuit breaker;
   the polarity of the first transient recovery voltage on the first output terminal with reference to the second output terminal of the second voltage source being the same as the polarity of the second transient recovery voltage on the first output terminal with reference to the second output terminal of the first voltage source.

2. A method as set forth in claim 1, wherein said step of conditioning comprises:
   causing said first interrupter unit or said train of interrupter units to be opened, and causing the rest of the interrupter units to be kept, in effect, closed.

3. A method as set forth in claim 2, wherein said rest of the interrupter units are shunted by a short-circuit conductor.

4. A method as set forth in claim 1, wherein said step of conditioning comprises:
   shunting each of the interrupter units by a capacitor, the capacitor provided for shunting said first interrupter unit or each of the interrupter units of said train being of greater capacitance than the capacitor provided for shunting each of the rest of the interrupter units, and operating all the interrupter units.

5. Apparatus for synthetic testing of a multi-break circuit breaker having a metallic tank forming the enclosure of the circuit breaker and a series connection of interrupter units supported by and insulated from the tank, and a first and a second lead conductors connected to the first and second ends of the series connection and being insulated from the tank, said apparatus comprising:
   a current source having its output terminals connected to the first and the second lead conductors for supplying a current through the series connection of the interrupter units;
   a first voltage source having its first and second output terminals connected, respectively, to the first and second lead conductors for supplying a first transient recovery voltage to be applied across the interrupter unit or units whose breaking performance is to be tested; and
   a second voltage source having its first and second output terminals connected, respectively, to the tank and the second lead conductor for supplying a second transient recovery voltage, having substantially the same magnitude as a whole transient recovery voltage to be applied across all the interrupter units of the circuit breaker, the polarity of the voltage on the first output terminal with reference to the second output terminal of the second voltage source being the same as the polarity of the voltage on the first output terminal with reference to the second output terminal of the first voltage source.

6. Apparatus as set forth in claim 5, further comprising:
   means for causing the current source to supply a current through the series connection of the interrupter units, and to terminate the supply of the current upon operation of the circuit breaker to be tested; and
   means for causing, when the interruption of the current through the series connection is completed, the first and second voltage sources to supply the first and second transient recovery voltages whereby the first transient recovery voltage is applied, in effect, across the interrupter unit or units whose breaking performance is to be tested and the second transient recovery voltage is applied across the tank and the second lead conductor.

7. Apparatus as set forth in claim 5, wherein said current source comprises a short-circuit generator, a transformer having its primary winding connected to the short-circuit generator and an auxiliary circuit breaker connected in series with the secondary winding, the current through the secondary winding being supplied through the auxiliary circuit breaker to the series connection of the interrupter units.

8. Apparatus as set forth in claim 7, wherein said first voltage source comprises a transformer having its primary winding connected to the short-circuit generator and having its secondary winding connected to the series connection of the interrupter units.

9. Apparatus as set forth in claim 5, wherein the first voltage source comprises a capacitor and a trigger gap connected in series with the capacitor, said apparatus further comprising means for charging the capacitor in advance, and means for triggering the trigger gap so that the voltage on the capacitor is supplied as the first transient recovery voltage.

10. Apparatus as set forth in claim 9, wherein the second voltage source comprises a capacitor, and a trigger gap connected in series with the capacitor, said apparatus further comprising means for charging the capacitor in advance, and means for triggering the trigger gap so that the voltage on the capacitor is supplied through the trigger gap as the second transient recovery voltage.

11. Apparatus as set forth in claim 10, wherein the first voltage source further comprises a reactor connected in series with the capacitor and the trigger gap, and the second voltage source further comprises a reactor connected in series with the capacitor and the trigger gap, the inductance of the reactor of the second voltage source being not smaller than the reactor of the first voltage source, and the capacitance of the capacitor of the second voltage source being not larger than that of the capacitor of the first voltage source.

* * * * *